United States Patent
Ogawa et al.

(10) Patent No.: US 11,211,416 B2
(45) Date of Patent: Dec. 28, 2021

(54) PHOTOELECTRIC CONVERSION APPARATUS HAVING LIGHT SHIELDING PORTIONS ABOVE SEMICONDUCTOR LAYER ON BACK SURFACE SIDE AND EQUIPMENT

(71) Applicant: CANON KABUSHIKI KAISHA, Tokyo (JP)

(72) Inventors: Toshiyuki Ogawa, Abiko (JP); Nobuhiko Sato, Yokohama (JP); Masaki Kurihara, Koza-gun (JP); Yoichi Wada, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/269,406

(22) Filed: Feb. 6, 2019

(65) Prior Publication Data
US 2019/0252439 A1    Aug. 15, 2019

(30) Foreign Application Priority Data
Feb. 9, 2018  (JP) .............................. JP2018-022398

(51) Int. Cl.
    *H01L 27/146*    (2006.01)
    *H01L 31/0216*   (2014.01)
(52) U.S. Cl.
    CPC .... *H01L 27/14623* (2013.01); *H01L 27/1464* (2013.01); *H01L 27/14621* (2013.01);
    (Continued)

(58) Field of Classification Search
    CPC .......... H01L 27/14623; H01L 27/1464; H01L 31/02164; H01L 27/14643;
    (Continued)

(56) References Cited

U.S. PATENT DOCUMENTS

| 2005/0077588 A1 | 4/2005 | Kasuga |
| 2012/0242874 A1* | 9/2012 | Noudo .............. H01L 27/14623 348/294 |

(Continued)

FOREIGN PATENT DOCUMENTS

| JP | 2001-250931 A | 9/2001 |
| JP | 2006-080457 A | 3/2006 |

(Continued)

*Primary Examiner* — Nelson Garces
(74) *Attorney, Agent, or Firm* — Canon U.S.A., Inc. IP Division

(57) ABSTRACT

A photoelectric conversion apparatus includes a semiconductor layer having a front surface and a back surface and in which a plurality of photoelectric conversion portions is provided between the front surface and the back surface, a wiring structure arranged on the front surface side of the semiconductor layer, a separation portion arranged between the plurality of photoelectric conversion portions and formed by a trench continuing from the back surface, a first light shielding portion arranged above the semiconductor layer on the back surface side so as to overlap the separation portion, and a second light shielding portion arranged above the semiconductor layer on the back surface side so as to face the first light shielding portion via a region located above at least one photoelectric conversion portion among the plurality of photoelectric conversion portions.

23 Claims, 8 Drawing Sheets

(52) U.S. Cl.
CPC .. *H01L 27/14627* (2013.01); *H01L 27/14636* (2013.01); *H01L 27/14643* (2013.01); *H01L 31/02164* (2013.01)

(58) Field of Classification Search
CPC ......... H01L 27/14636; H01L 27/14627; H01L 27/14621; H01L 27/1463
See application file for complete search history.

(56) References Cited

U.S. PATENT DOCUMENTS

| | | |
|---|---|---|
| 2013/0070131 A1 | 3/2013 | Ohkubo |
| 2014/0054662 A1 | 2/2014 | Yanagita |
| 2014/0346628 A1 | 11/2014 | Okazaki |
| 2015/0076643 A1 | 3/2015 | Kikuchi |
| 2016/0276394 A1 | 9/2016 | Chou |
| 2017/0213860 A1 | 7/2017 | Ukigaya |
| 2017/0338265 A1 | 11/2017 | Yoshiba |
| 2018/0308883 A1 | 10/2018 | Yanagita |
| 2019/0165009 A1* | 5/2019 | Wu ........................ H04N 5/374 |
| 2020/0027913 A1* | 1/2020 | Nomura ............ H01L 27/14623 |

FOREIGN PATENT DOCUMENTS

| | | | |
|---|---|---|---|
| JP | 2009-158800 A | | 7/2009 |
| JP | 2009158800 A | * | 7/2009 |
| JP | 2010-186818 A | | 8/2010 |
| JP | 2011-176715 A | | 9/2011 |
| JP | 2014-229810 A | | 12/2014 |
| JP | 2016-031993 A | | 3/2016 |
| JP | 2017-011207 A | | 1/2017 |
| JP | 2017-55127 A | | 3/2017 |
| JP | 2017-139286 A | | 8/2017 |

\* cited by examiner

PHOTOELECTRIC CONVERSION APPARATUS HAVING LIGHT SHIELDING PORTIONS ABOVE SEMICONDUCTOR LAYER ON BACK SURFACE SIDE AND EQUIPMENT

BACKGROUND OF THE INVENTION

Field of the Invention

The present invention relates to a light shielding structure of a photoelectric conversion apparatus and to a photoelectric conversion apparatus and equipment utilizing the same.

Description of the Related Art

In a back surface irradiation type photoelectric conversion apparatus, a trench-type separation portion is formed on the back surface side of a semiconductor layer and/or a light shielding member is disposed on the back surface of the semiconductor layer to reduce crosstalk between pixels. Japanese Patent Application Laid-Open No. 2017-55127 discusses a structure in which both a trench-type element separation portion and a light shielding film are provided.

Light that enters between a light shielding member and a trench-type separation portion can cause crosstalk. The present invention is directed to a photoelectric conversion apparatus capable of reducing crosstalk.

SUMMARY OF THE INVENTION

According to an aspect of the present invention, a photoelectric conversion apparatus includes a semiconductor layer having a front surface and a back surface and in which a plurality of photoelectric conversion portions is provided between the front surface and the back surface, a wiring structure arranged on the front surface side of the semiconductor layer, a separation portion arranged between the plurality of photoelectric conversion portions and formed by a trench continuing from the back surface, a first light shielding portion arranged above the semiconductor layer on the back surface side so as to overlap the separation portion, and a second light shielding portion arranged above the semiconductor layer on the back surface side so as to face the first light shielding portion via a region arranged above at least one photoelectric conversion portion among the plurality of photoelectric conversion portions, wherein a surface of the first light shielding portion that is located so as to face the second light shielding portion has a first edge located on the semiconductor layer side, wherein a surface of the second light shielding portion that is arranged so as to face the first light shielding portion has a second edge located on an opposite side of the light shielding portion to the semiconductor layer side, and a boundary between the back surface and a side surface of the separation portion that is arranged adjacent the photoelectric conversion portion side is positioned below the first light shielding portion, and wherein $H/D > (W+L)/L$ is satisfied, where W is a distance between the first edge and the second edge in a first direction along the back surface of the semiconductor layer, L is a distance between the second edge and the boundary in the first direction, H is a distance between the back surface and the second edge in a second direction from the front surface toward the back surface of the semiconductor layer, and D is a distance between the first edge and the boundary in the second direction.

According to another aspect of the present invention, a photoelectric conversion apparatus includes a semiconductor layer having a front surface and a back surface and in which a plurality of photoelectric conversion portions is provided between the back surface and the front surface, a wiring structure arranged on the front surface side of the semiconductor layer, a separation portion arranged between the plurality of photoelectric conversion portions and formed by a trench continuing from the back surface, a first light shielding portion arranged above the semiconductor layer on the back surface side so as to overlap the separation portion, and a second light shielding portion arranged above the semiconductor layer on the back surface side so as to face the first light shielding portion via a region arranged above at least one photoelectric conversion portion among the plurality of photoelectric conversion portions, wherein a surface of the first light shielding portion that is arranged so as to face the second light shielding portion has a first edge located on the semiconductor layer side, wherein a surface of the first light shielding portion that is arranged so as to face the first light shielding portion has a second edge located on an opposite side of the light shielding portion to the semiconductor layer side, and wherein $Wa - Wb > Wc/2$ and $Wa - Wb > G - Wc$ are satisfied, where Wa is the distance between the second edge and the second light shielding portion in a first direction along the back surface of the semiconductor layer, Wb is a distance between the first edge and the second light shielding portion in the first direction, Wc is a width of the first light shielding portion in the first direction at a height located at an equal distance from the first edge and the second edge, and wherein each of the first and second light shielding portions have a surface arranged to face each other each face having a first edge located on the semiconductor layer side and a second edge located on an opposite side of the light shielding portion to the semiconductor layer side, wherein $Wa - Wb > Wc/2$ and $Wa - Wb > G - Wc$ are satisfied, where Wa is the distance between the second edges of the first and the second light shielding portion in a first direction along the back surface of the semiconductor layer, Wb is a distance between the first edges of the first and the second light shielding portions in the first direction, Wc is a width of the first light shielding portion or the second light shielding portion in the first direction at a height located at an equal distance from the first edge and the second edge, G is a width of the separation portion in the first direction at a position at which the width is a half of a depth of the separation portion in a second direction from the front surface toward the back surface.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

DESCRIPTION OF THE EMBODIMENTS

Figure 1A:
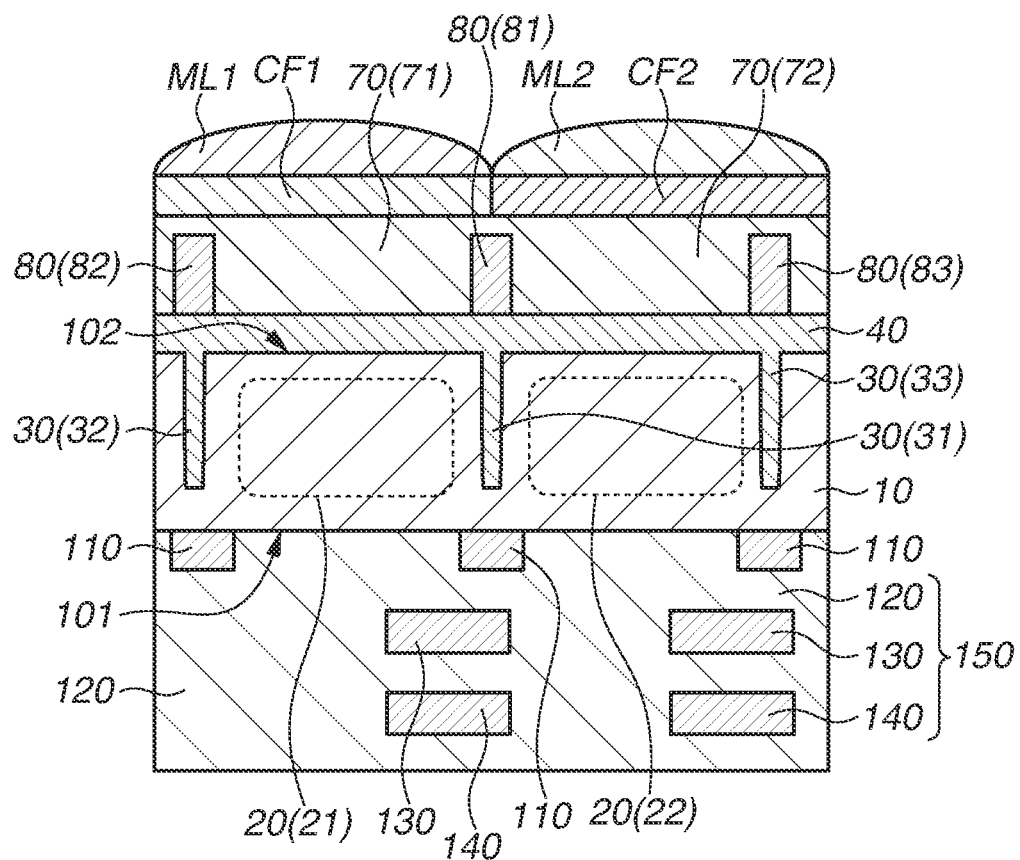
FIGS. 1A and 1B are diagrams schematically illustrating a photoelectric conversion apparatus.

Various exemplary embodiments of the present invention will be described below with reference to the drawings. In the following descriptions and the drawings, a common structure is given the same reference numeral across the plurality of drawings. Thus, a common structure will be described with reference to a plurality of drawings, and description of a structure given the same reference numeral will be omitted when appropriate. The scope of the disclosure of the exemplary embodiments encompasses not only those specified in the present specification but also those that can be understood from the present specification and the drawings attached to the present specification. Further, structures that have similar names but are given different reference numerals are discriminable using reference terms such as "first structure", "second structure", and "third structure".

A back surface irradiation type complementary metal oxide semiconductor (CMOS) sensor is a photoelectric conversion apparatus. Such a CMOS sensor has no wiring structure in a region where light enters the sensor and, thus, the CMOS sensor has the advantage of improved sensitivity. Meanwhile, in a case in which a light beam with a small incidence angle enters, if there is no member to block the light beam with a small incidence angle, part of the incident light beam will leak into an adjacent pixel in the light transmitting member or semiconductor layer, and thus optical color mixture will occur. To ameliorate this problem, it is effective to employ the technique of providing a light shielding structure in a region where light enters or the technique of providing a trench separation structure between pixels. In the present exemplary embodiment, a combination of a light shielding structure and a trench separation structure will be presented and an advantageous structure for reducing crosstalk, that can occur through a gap between the light shielding structure and the trench separation structure, will be described below.

FIG. 1A is a cross-sectional diagram illustrating a back surface irradiation type photoelectric conversion apparatus. A photoelectric conversion apparatus APR includes a semiconductor layer 10, a wiring structure 150, a separation portion 31, a light shielding portion 81, and a light shielding portion 82. The semiconductor layer 10 has a front surface 101 and a back surface 102.

In the semiconductor layer 10, a plurality of photoelectric conversion portions 20 (21, 22) are provided between the front surface 101 and the back surface 102. The semiconductor layer 10 including the photoelectric conversion portions 20 can also be referred to as a photoelectric conversion layer. The material of the semiconductor layer 10 is typically a monocrystalline semiconductor layer such as a silicon but can be polycrystalline or amorphous silicon. Further, the material is not limited to an inorganic semiconductor material and can be an organic semiconductor material. The semiconductor layer 10 includes trenches 30 which continue from the back surface 102. The trenches 30 are arranged between the plurality of photoelectric conversion portions 20. The part of each of the trenches 30 that is arranged between the photoelectric conversion portion 21 and the photoelectric conversion portion 22 forms the separation portion 31. The photoelectric conversion portions 21 and 22 are respectively arranged between the separation portion 31 and separation portions 32 and 33 formed of other parts of the trench 30. The photoelectric conversion portion 20 is typically a photodiode. With reference to the back surface 102 of the semiconductor layer 10, the directions along the back surface 102 will be referred to as "X- and Y-directions", and the direction from the front surface 101 toward the back surface 102 will be referred to as "Z-direction". The X-, Y-, and Z-directions are orthogonal to one another. The X- and Y-directions are parallel to the back surface 102 and the front surface 101, whereas the Z-direction is perpendicular to the back surface 102 and the front surface 101. As illustrated in FIG. 1, the front surface 101 side will be referred to as "lower side" and the back surface 102 side as "upper side".

The structure of the back surface 102 side will be described. Each of the light shielding portions 81 and 82 is a part of a light shielding member 80. The light shielding member 80 is made of metal, metal compound, or black resin. A suitable metal for use in the light shielding member 80 is tungsten or aluminum. In a case in which the main component of the light shielding member 80 is tungsten, if the width of the light shielding portions 81, 82, and 83 is 100 nm or more, the attenuation rate of a transmitted light beam is −50 dB or more and thus adequate light shielding performance can be achieved. In a case in which the width of the light shielding portions 81, 82, and 83 is 200 nm or more, the attenuation rate of a transmitted light beam is −100 dB or more, which is more desirable. The light shielding portion 81 is arranged above the semiconductor layer 10 on the back surface 102 side so as to overlap the separation portion 31. The light shielding portion 82 is arranged above the semiconductor layer 10 on the back surface 102 side so as to overlap the separation portion 32. The light shielding portion 83 is arranged above the semiconductor layer 10 on the back surface 102 side so as to overlap the separation portion 33. A separation member 40 is provided between the light shielding member 80 and the semiconductor layer 10 to separate the light shielding member 80 and the semiconductor layer 10. The parts of the separation member 40 that are arranged inside the trench 30 respectively form the separation portions 31, 32, and 33.

The light shielding portion 82 is arranged to face the light shielding portion 81 via a light transmitting region 71 arranged above at least one photoelectric conversion portion 21 of the plurality of photoelectric conversion portions 20. Similarly, the light shielding portion 83 is arranged to face the light shielding portion 81 via a light transmitting region 72 arranged above another photoelectric conversion portion 22 of the plurality of photoelectric conversion portions 20. The light transmitting regions 71 and 72 are part of a light transmitting member 70. A color filter CF1 is provided on the light transmitting region 71 and a microlens ML1 is provided on the color filter CF1, and a color filter CF2 is provided on the light transmitting region 72 and a microlens ML2 are provided on the color filter CF2.

Next, a structure of the front surface 101 side will be described. A transistor including a gate electrode 110 is provided on the front surface 101 side of the semiconductor layer 10. The wiring structure 150 is provided on the front surface 101 side of the semiconductor layer 10. The wiring structure 150 has a multi-layer wiring structure including an insulation member 120 including a plurality of inter-layer insulation films and a plurality of wiring layers 130 and 140.

Figure 1B:
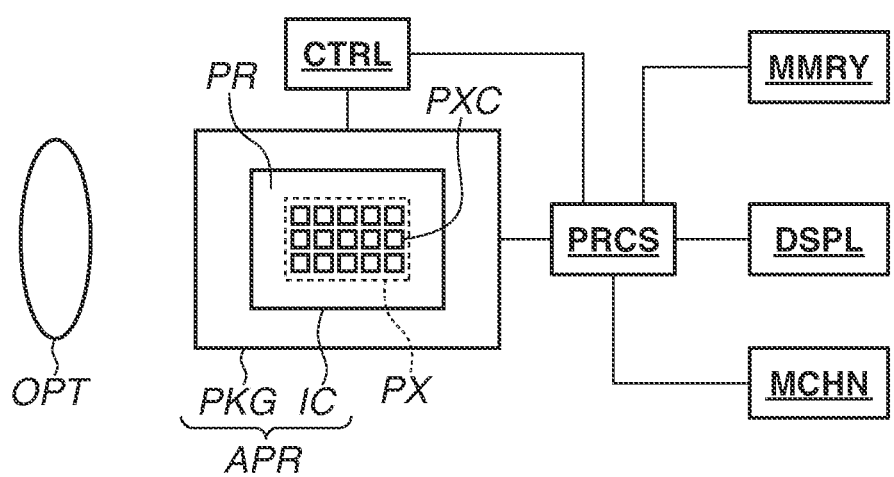

FIG. 1B is a block diagram schematically illustrating equipment EQP including the photoelectric conversion apparatus APR. The entire photoelectric conversion apparatus APR or part of the photoelectric conversion apparatus APR is a semiconductor device IC. The photoelectric conversion apparatus APR in the present exemplary embodiment can be used as, for example, an image sensor, auto-focus (AF) sensor, photometric sensor, or distance measurement sensor. The semiconductor device IC of the equipment EQP includes a pixel area PX in which pixel circuits PXC including the photoelectric conversion portion 20 are arranged in a matrix form. The semiconductor device IC can include a peripheral area PR around the pixel area PX. In the peripheral area PR, a circuit other than the pixel circuit PXC can be arranged. The photoelectric conversion apparatus APR can include a package PKG for storing the semiconductor device IC in addition to the semiconductor device IC. The equipment EQP can further include at least one of an optical system OPT, a control apparatus CTRL, a processing apparatus PRCS, a display apparatus DSPL, a storage apparatus MMRY, and a mechanical apparatus MCHN. Details of the equipment EQP will be described below.

Figure 2A:
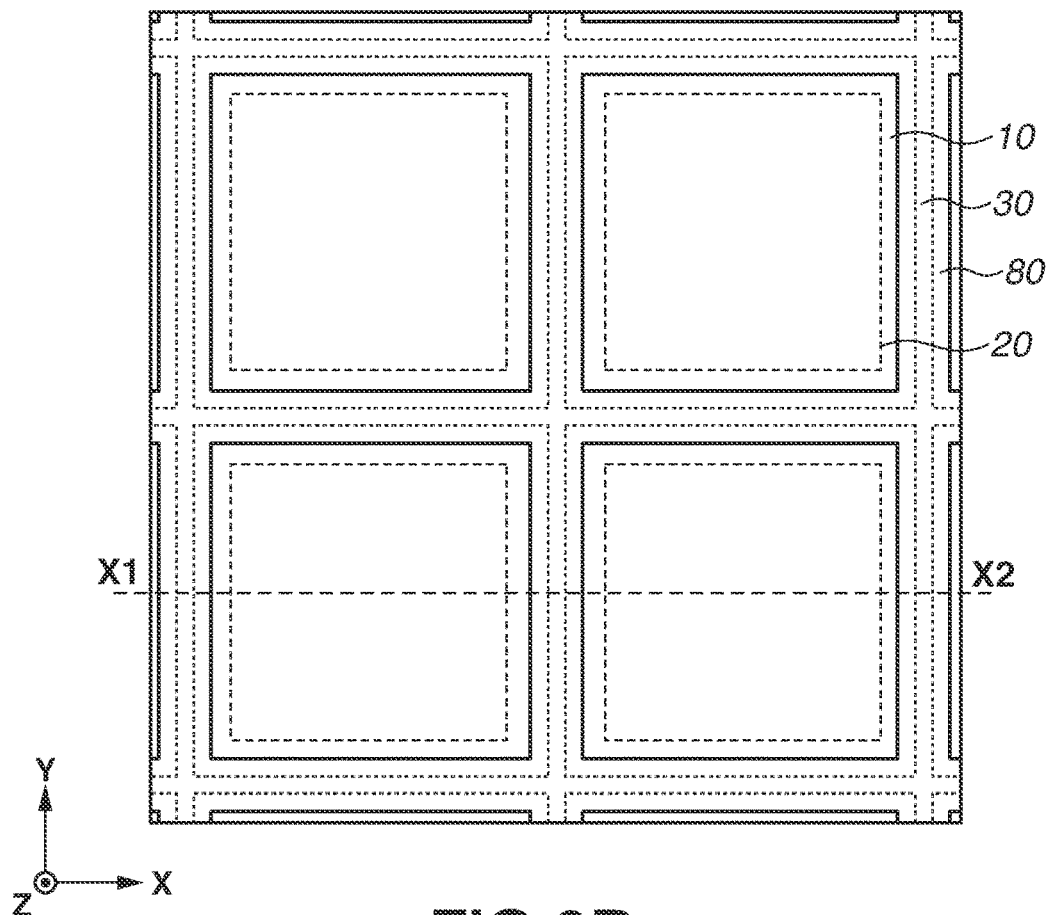
FIGS. 2A and 2B are diagrams schematically illustrating a photoelectric conversion apparatus.
Figure 2B:
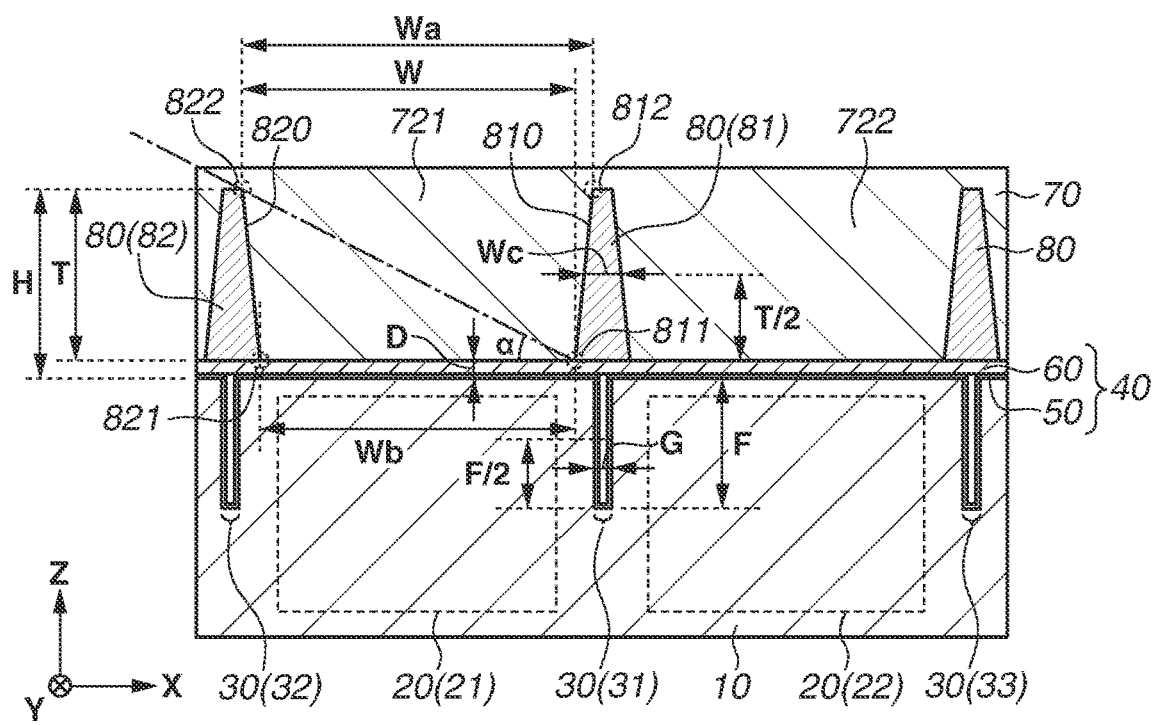

A first exemplary embodiment will be described with reference to FIGS. 2A, 2B, and 3. FIG. 2A is a plan view including the photoelectric conversion portions 20 of four pixels. FIGS. 1A and 2B are cross-sectional views taken along line X1-X2 specified in FIG. 2A. As apparent from FIG. 2A, the light shielding member 80 is in a lattice form, and the light transmitting regions 71 and 72 are defined by an opening of the light shielding member 80. FIG. 2A illustrates how the light shielding member 80 and the trench 30 overlap.

A positional relationship between the light shielding portions 81 and 82 will be described in detail with reference to FIG. 2B. The light shielding portion 81 includes a side surface 810, which is the surface on the light transmitting region 71 side. The edge of the side surface 810 that is located on the semiconductor layer 10 side (lower side) is a lower edge 811. The edge of the side surface 810 that is located on the opposite side (upper side) of the semiconductor layer 10 side (lower side) is an upper edge 812. The light shielding portion 82 includes a side surface 820, which is the surface located on the light transmitting region 71 side. The edge of the side surface 820 that is located on the semiconductor layer 10 side (lower side) is a lower edge 821. The edge of the side surface 820 that is located on the opposite side (upper side) of the semiconductor layer 10 side (lower side) is an upper edge 822.

The distance between the lower edge 811 and the upper edge 822 in the X-direction will be referred to as "distance W". While the lower edge 811 and the upper edge 822 are located at different positions in the Z-direction, the distance between the two edges in the X-direction is focused only on the X-direction component. The distance between the upper edge 812 and the light shielding portion 82 (upper edge 822) in the X-direction will be referred to as a "distance Wa". The distance between the lower edge 811 and the light shielding portion 82 (lower edge 821) in the X-direction will be referred to as a "distance Wb". The width of the light shielding portion 81 in the X-direction at the height of the equal distance from the lower edge 811 and the upper edge 812 will be referred to as a "width Wc". The distance between the lower edge 821 and the upper edge 822 in the Z-direction will be referred to as a "distance T". The distance between the lower edge 811 and the upper edge 812 in the Z-direction is also the distance T. The distance T corresponds to the thickness of the light shielding member 80 (light shielding portions 81 and 82). The width Wc is the width of the light shielding portion 81 at the position at which the thickness of the light shielding portion 81 becomes a half (T/2). The distance between the lower edges 811 and 821 and the back surface 102 in the Z-direction will be referred to as a "distance D". The distance D corresponds to the height of the lower edges 811 and 821 from the back surface 102. The sum of the distances D and T will be referred to as a "distance H" (D+T=H). The distance H corresponds to the height of the upper edges 812 and 822 from the back surface 102.

In FIG. 2B, the straight line connecting the lower edge 811 and the upper edge 822 is specified by a one-dot chain line. The one-dot chain line forms an angle α with the back surface 102. As apparent from FIG. 2B, tan α=T/W.

The separation member 40 can include a dielectric film 50 and an insulation film 60. The dielectric film 50 is provided between the insulation film 60 and the semiconductor layer 10. The dielectric film 50 can be a metal oxide film such as an aluminum oxide film or a hafnium oxide film. The typical dielectric film 50 is thinner than the insulation film 60. The dielectric film 50 covering the back surface 102 can be an anti-reflection film. The insulation film 60 can be a flattening film for improving the flatness of the back surface 102 side or an insulation film for insulating the light shielding member 80 and the semiconductor layer 10. The dielectric film 50 and the insulation film 60 each include an opening portion at a position (not illustrated), and the light shielding member 80 (light shielding portions 81, 82, 83) is electrically connected to the semiconductor layer 10 at a position (not illustrated) through the opening portion. In this way, a predetermined potential is supplied to the light shielding member 80 to prevent the potential of the light shielding member 80 from becoming a floating state.

A positional relationship between the light shielding portion 81 and the separation portion 31 will be described in detail with reference to FIG. 3. In FIG. 3, the distances H, T, D specified in FIG. 2B are schematically illustrated. In FIG. 3, the one-dot chain line specified in FIG. 2B is also illustrated.

The trench 30 in which the separation portion 31 is arranged includes a side surface 301 on the photoelectric conversion portion 21 side and a side surface 302 on the photoelectric conversion portion 21 side. A boundary 131 between the back surface 102 and the side surface 301 of the trench 30 on the photoelectric conversion portion 21 side is located below the light shielding portion 81. The distance between the lower edge 811 and the boundary 131 in the X-direction will be referred to as a "distance L". The distance between the lower edge 811 and the boundary 131 in the Z-direction will be referred to as a "distance D". The lower edge 811 and the boundary 131 are located at different positions in both the Z- and X-directions. However, the distance between the lower edge 811 and the boundary 131 in the X-direction is focused only on the X-direction component, and the distance between the lower edge 811 and the boundary 131 in the Z-direction is focused only on the Z-direction component. The length of the separation portion 31 in the Z-direction will be referred to as a "length F". The length F corresponds to the depth of the trench 30. In a case in which the separation portion 31 is extended to the front surface 101, the length F of the separation portion 31 (the depth of the trench 30) is equal to the thickness of the semiconductor layer 10 and to the distance between the front surface 101 and the back surface 102. The length F is desirably not shorter than a quarter of the thickness of the semiconductor layer 10. The width of the separation portion 31 in the X-direction at a position at which a depth is ½ of the length F of the separation portion 31 (the depth of the trench 30) will be referred to as a "width G". In other words, the width G is the width of the separation portion 31 in the X-direction at a halfway down the trench 30.

The back surface 102 and the side surfaces 301 and 302 of the trench 30 are covered by the dielectric film 50 included in the separation member 40. The dielectric film 50 also covers the boundary 131. The dielectric film 50 can be a charge fixing film having the role of reducing dark current by fixing the charge in the vicinity of the back surface 102 of the semiconductor layer 10 and the side surfaces 301 and 302 of the trench 30. The dielectric film 50 may cover only one of the back surface 102 and the side surfaces 301 and 302 of the trench 30.

Figure 3:
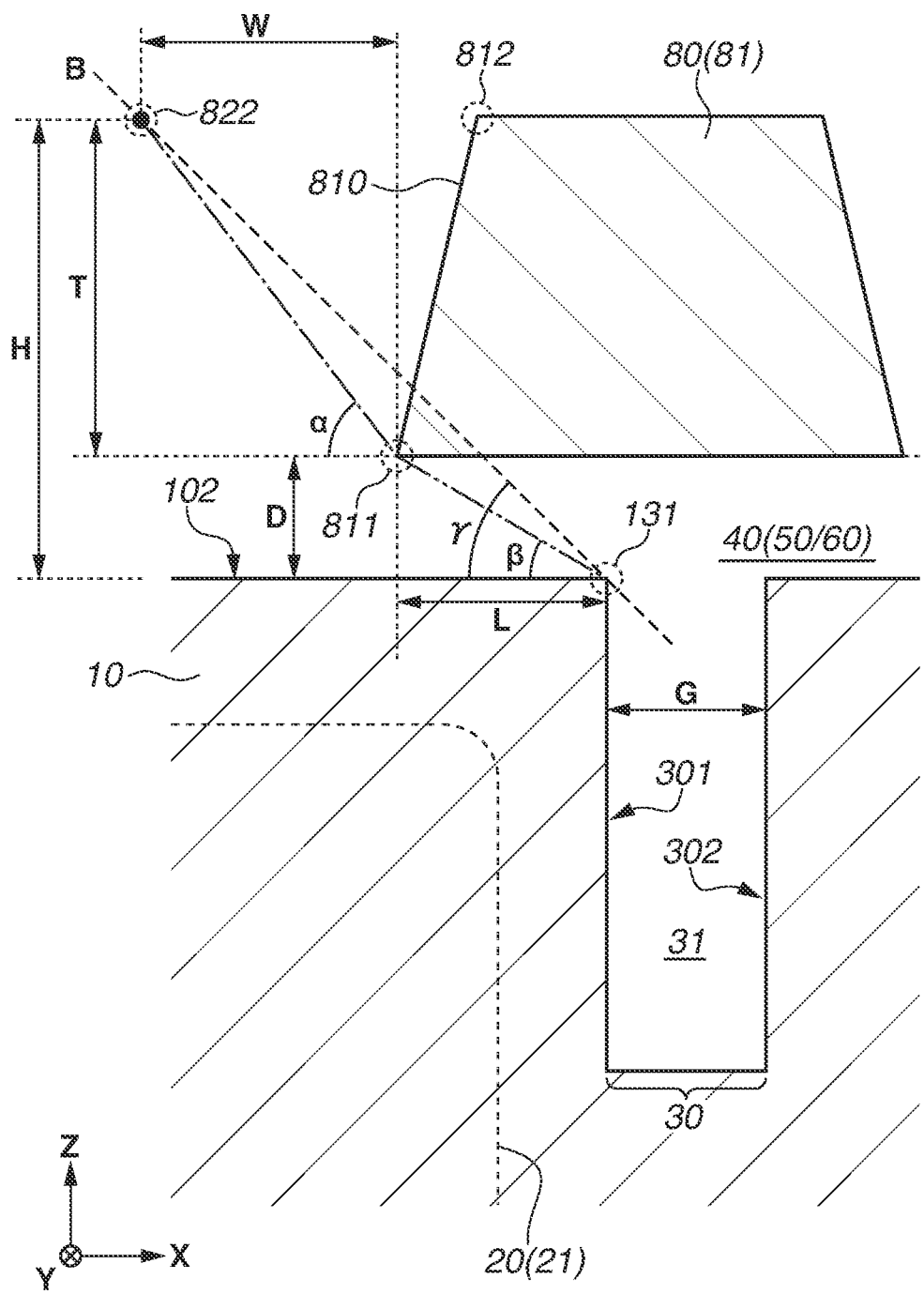
FIG. 3 is a diagram schematically illustrating a photoelectric conversion apparatus.

In FIG. 3, the straight line connecting the lower edge 811 and the boundary 131 is specified by a two-dot chain line. The two-dot chain line forms an angle β with the back surface 102. As apparent from FIG. 3, tan β=D/L.

Assume a light beam that enters the light shielding portion 82 from the opposite side of the light transmitting region 71 along a long chain line B at a predetermined angle. The long chain line B is the line connecting the upper edge 822 and the boundary 131. The long chain line B forms an angle γ with the back surface 102.

Assume an example case in which the light shielding portion 81 does not exist. A light beam that skims past the upper edge 822 and enters at a larger angle than the angle γ enters not the trench 30 but the back surface 102 above the photoelectric conversion portion 21. The light beam that skims past the upper edge 822 and enters at a smaller angle than the angle γ enters the trench 30. The light beam that enters the trench 30 becomes an optical noise source such as crosstalk in photoelectric conversion and, thus, needs to be reduced as much as possible. In order to reduce the light, the lower edge 811 needs to be located below the long chain line B. The state in which the lower edge 811 is located below the long chain line B corresponds to the state in which α>β or γ>β is satisfied. This is geometrically understandable from FIG. 3.

A case of α>β is studied. If α>β, tan α>tan β. As described above, since tan α=T/W and tan β=D/L, T/W>D/L. As H=T+D, T=H−D, this is substituted into T/W>D/L, and the obtained result is modified. Consequently, H/D>(W+L)/L is obtained.

A case of γ>β is studied. If γ>β, tan γ>tan β. Since tan γ=H/(L+W) and tan β=D/L, H/(L+W)>D/L. This is modified, and H/D>(W+L)/L is obtained.

As described above, if H/D>(W+L)/L is satisfied, light is prevented from entering the trench 30. Since no denominator of a fraction is zero, the above-described formula holds if D>0 and L>0. The formula expressed as L/(W+L)>D/H can hold if L>0 even if D=0.

Increasing the distance L consequently limits the light to enter the photoelectric conversion portion 20 and, thus, can lead to a decrease in sensitivity. However, if the distance L is sufficiently smaller than the distance W that corresponds to the substantial opening width, the effect of the distance L on the decrease in sensitivity is limited. More specifically, it is desirable to satisfy L<0.4×W.

In order to satisfy H/D>(W+L)/L, it is effective to reduce the distance D and increase the distance L, so that it is effective to satisfy D<L. However, increasing the distance L causes a decrease in sensitivity, so that in a case in which the effect of the distance L on the decrease in sensitivity is significant (e.g., a case in which the distance W is 2 μm or less), it is desirable to satisfy L<D.

The part that corresponds to the distance L is the semiconductor layer 10, which is a region capable of performing photoelectric conversion. On the other hand, the trench 30 (separation portion 31) is a region not capable of performing photoelectric conversion. Thus, in the comparison of the distance L and the width G, it is desirable to satisfy G/2<L, and it is more desirable to satisfy G<L in order to improve sensitivity.

The distance D is reduced to thereby prevent a light beam at a small incidence angle from passing between the light shielding portion 81 and the separation portion 31. The distance D can be reduced by reducing the size of the dielectric film 50 and/or the insulation film 60. In the case in which the dielectric film 50 and/or the insulation film 60 is thinned, the semiconductor layer 10 can be damaged at the time of forming the light shielding member 80, and noise such as dark current is more likely to occur. It is desirable to form the dielectric film 50 and the insulation film 60 with a sufficient thickness on the side surfaces 301 and 302 of the trench 30. Accordingly, the width G of the trench 30 is desirably two or more times larger than the sum of the film thicknesses of the dielectric film 50 and the insulation film 60 on the back surface 102. If the distance D is approximately expressed as the sum of the film thicknesses of the dielectric film 50 and the insulation film 60, G>2×D is obtained. In other words, D<G/2. If the dielectric film 50 is to be formed thinner than the insulation film 60, D<G can also be obtained.

In the example illustrated in FIG. 2B, the side surfaces 810 and 820 are sloped. Thus, Wa−Wb>0. To satisfy L/(W+L)>D/H, Wa−Wb≤0 is also allowable. However, in order to widen the entrance of the light transmitting region 71 to increase sensitivity while reducing optical noise, it is desirable to satisfy Wa−Wb>Wc/2. This indicates that the sizes of the entrance and exit of the light transmitting region 71 are significantly larger than the width Wc of the light shielding portion 81. Further, Wa−Wb>Wc is also allowable.

Further, in order to shield the separation portion 31 from light by the light shielding portion 81 as appropriate, it is desirable to satisfy Wa−Wb>G−Wc. This indicates that the lower surface of the light shielding portion 81 is significantly larger than the width G of the separation portion 31.

The sensitivity is improved by reducing the width Wc, so that it is also desirable to satisfy Wc<G. Further, the sensitivity is improved also by not excessively increasing the width G, so that it is also desirable to satisfy G<3×Wc/2. It is desirable to satisfy at least one of Wc<G and G<3×Wc/2. G<3×Wc/2 is a condition to satisfy Wc/2>G−Wc in the relationship between the right side of Wa−Wb>G−Wc and the right side of Wa−Wb>Wc/2. This indicates that the difference between the widths G and Wc is desirably less than a half of the width Wc, and the widths Wc and G are desirably small and close to each other. Accordingly, in order to improve the sensitivity, it is desirable to satisfy Wc<G<3× Wc/2.

Examples of the respective dimensions described above are as follows. The distance W is, for example, 500 nm to 5 μm. The distance L is, for example, 100 nm to 1 μm. The distance D is, for example, 50 nm to 500 nm. The distance T is, for example, 100 nm to 5 μm. The width Wc is, for example, 100 nm to 1 μm.

Figure 4A:
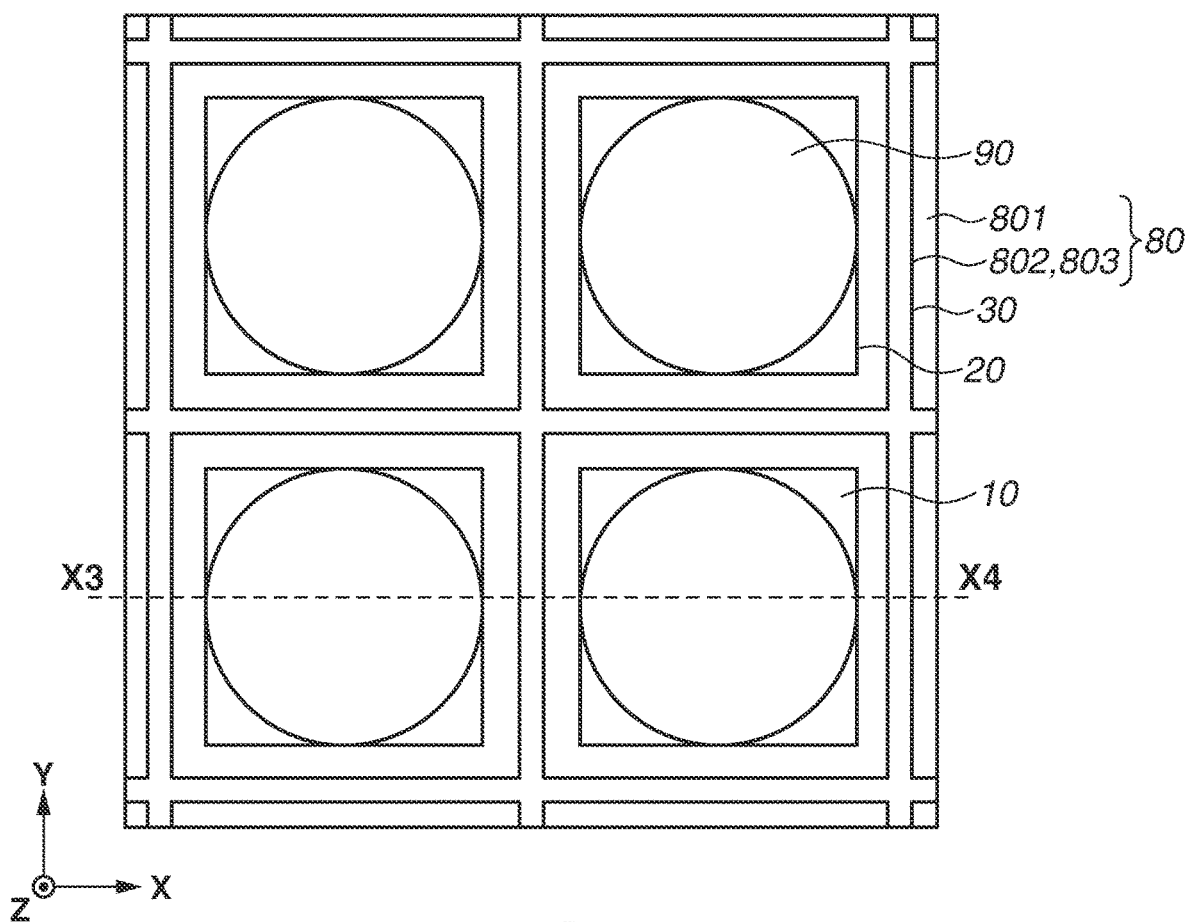
FIGS. 4A and 4B are diagrams schematically illustrating a photoelectric conversion apparatus.
Figure 4B:
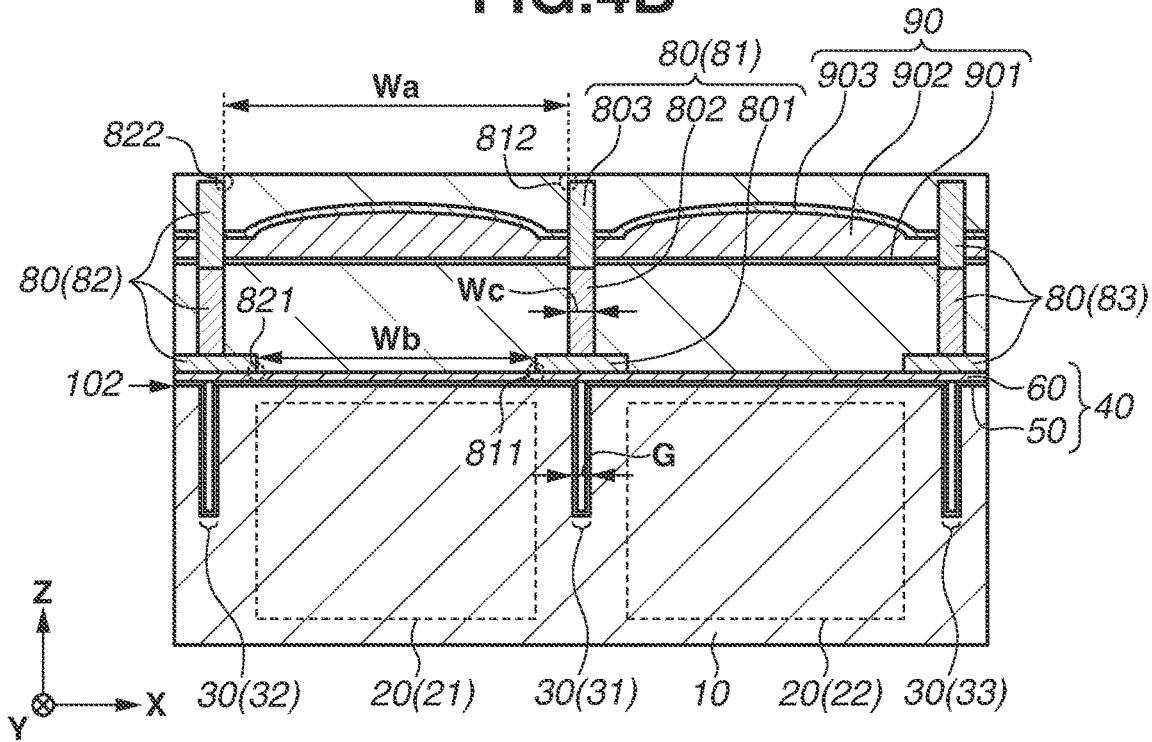

A second exemplary embodiment will be described with reference to FIGS. 4A and 4B. FIG. 4B is a cross-sectional view taken along a line X3-X4 specified in FIG. 4A. Description of items that can be similar to those in the other exemplary embodiments is omitted, and only a point that is different from that of the other exemplary embodiments will mainly be described below.

The second exemplary embodiment uses the light shielding member 80 suitable to satisfy at least one of the above-described relationships H/D>(W+L)/L, Wa−Wb>Wc/2, and Wa−Wb>G−Wc. The light shielding member 80 (light shielding portions 81, 82, and 83) includes a lower part 801, a middle part 802, and an upper part 803 in this order from the semiconductor layer 10 side. The width of the lower part 801 is less than the widths of the middle part 802 and the upper part 803 to thereby obtain a shape that is suitable to increase the distance L. The thickness of the lower part 801 is sufficiently smaller than the total thickness of the upper part 803 and the middle part 802 and the respective thicknesses of the upper part 803 and the middle part 802 to thereby widen the light transmitting region 71 so that the sensitivity is improved. The width of the lower part 801 is smaller than the total thickness of the upper part 803 and the middle part 802. The width of the lower part 801 is smaller than each of the thicknesses of the upper part 803 and the middle part 802. Further, the width of the middle part 802 is close to the width of the upper part 803 to thereby obtain a shape that is suitable to reduce the width Wc of the middle part 802. While the angle formed by the upper surface of the lower part 801 and the side surface of the middle part 802 and the upper part 803 is 90 degrees in the present exemplary embodiment, the angle can be about 45 degrees to about 135 degrees. In this structure, the distance L is changeable independently of the widths W, Wa, and Wc by changing the widths of the upper part 803 and the middle part 802 of the light shielding member 80. A case of increasing the distance L will be studied here. In a case in which the light shielding portion 81 is trapezoidal, in order to increase the distance L, the entire width (e.g., width Wc) of the light shielding portion 81 needs to be increased, and in a case in which the pixel pitch is not changed, the widths W and Wa are decreased. Thus, the rate at which incident light passes through the opening of the light shielding member 80 decreases, and thus the sensitivity is decreased. On the contrary, in the present exemplary embodiment, the width of the lower part 801 is increased while the widths of the upper part 803 and the middle part 802 are reduced.

An interlayer lens 91 is provided between the light shielding portions 81 and 82, and an interlayer lens 92 is provided between the light shielding portions 81 and 83. An interlayer lens member 90 that forms the interlayer lenses 91 and 92 can include a silicon nitride layer 902, an anti-reflection layer 901 provided under the silicon nitride layer 902, and an anti-reflection layer 903 provided on the silicon nitride layer 902. The interlayer lenses 91 and 92 are respectively provided above the photoelectric conversion portions 21 and 22 and converge incident light to the centers of the photoelectric conversion portions 21 and 22. Although the width Wb is less than the width Wa, since incident light is converged by the interlayer lenses 91 and 92, the sensitivity is less likely to decrease.

Figure 5A:
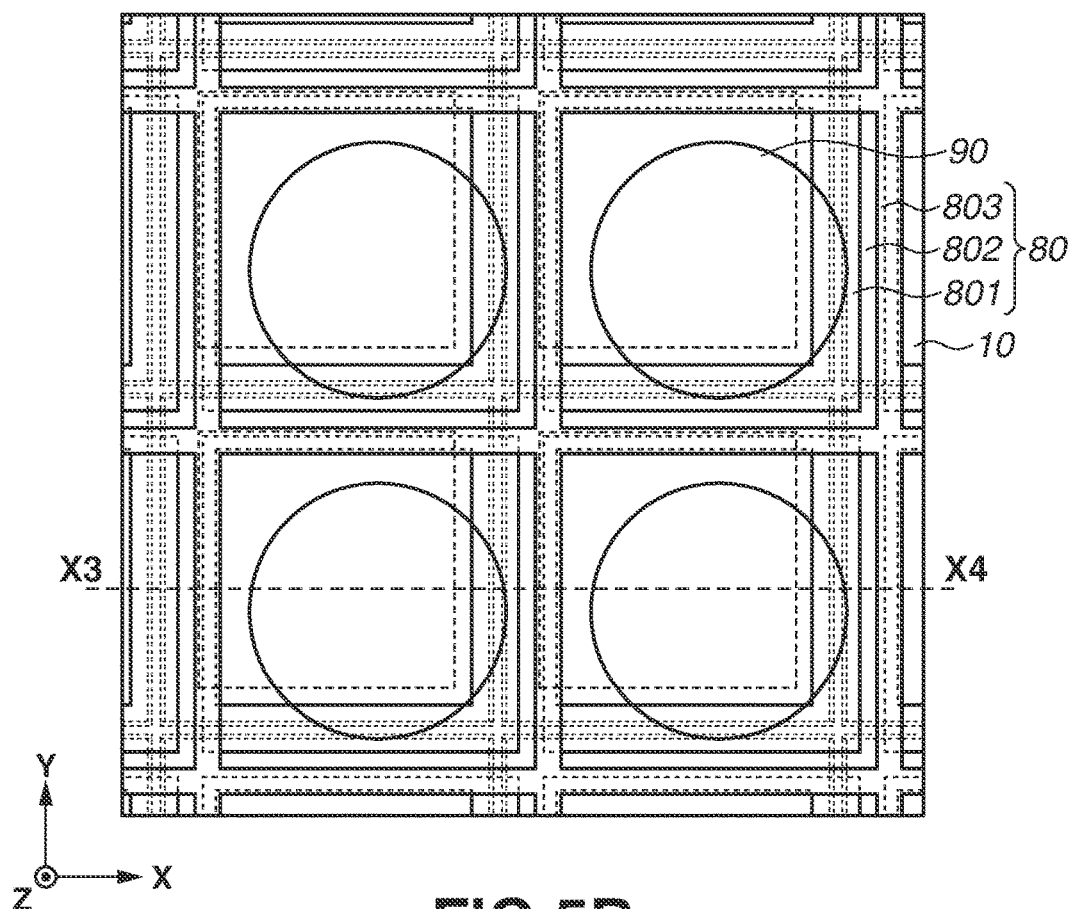
FIGS. 5A and 5B are diagrams schematically illustrating a photoelectric conversion apparatus.
Figure 5B:
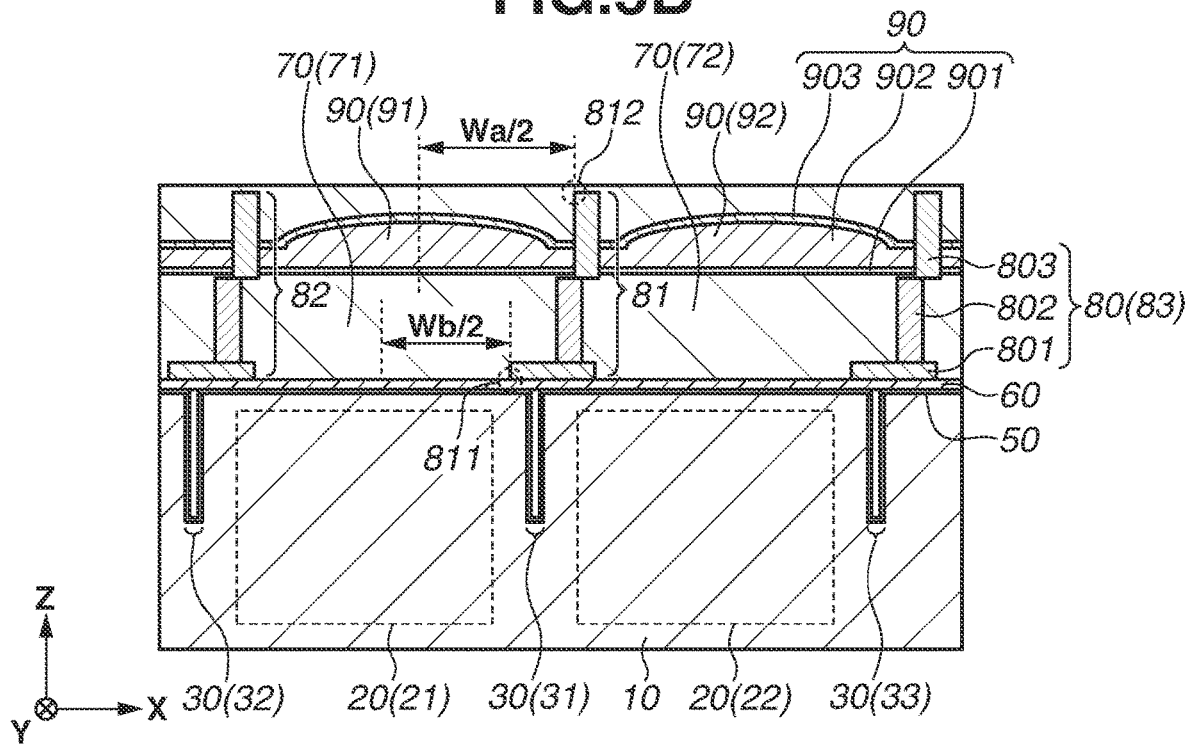

A third exemplary embodiment as a modified example of the second exemplary embodiment will be described with reference to FIGS. 5A and 5B. In the present exemplary embodiment, the planar positions of the lower part 801, the middle part 802, the upper part 803, and the interlayer lenses 91 and 92 are shifted from the photoelectric conversion portions 21 and 22 based on the incidence angle of a main light beam. Thus, the position in the light transmitting region 71 at which the distance from the upper edge 812 of the light shielding portion 81 in the X-direction is Wa/2 does not overlap the position in the light transmitting region 71 at which the distance from the lower edge 811 in the X-direction is Wb/2. In this way, the main light beam is shielded by the light shielding member 80 to thereby prevent a decrease in sensitivity.

In a photoelectric conversion apparatus including a large image capturing area, the difference in incidence angle between the central and peripheral parts of the image capturing area is sometimes large. In this case, even if uniform light is applied to the entire surface of the image capturing area, the pixel output differs (shading occurs) between the central and peripheral parts of the image capturing area. On the contrary, the structure as described in the present exemplary embodiment is capable of reducing shading.

Figure 6A:
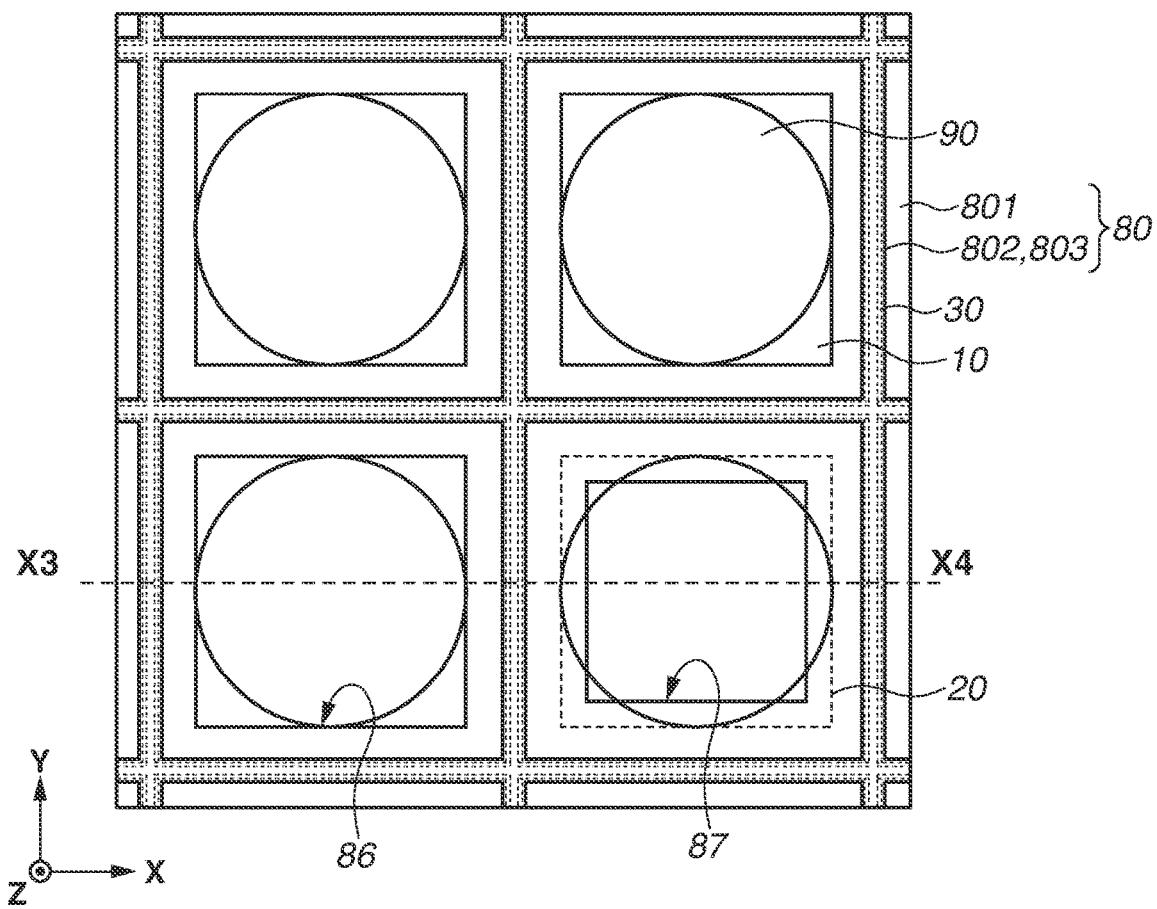
FIGS. 6A and 6B are diagrams schematically illustrating a photoelectric conversion apparatus.
Figure 6B:
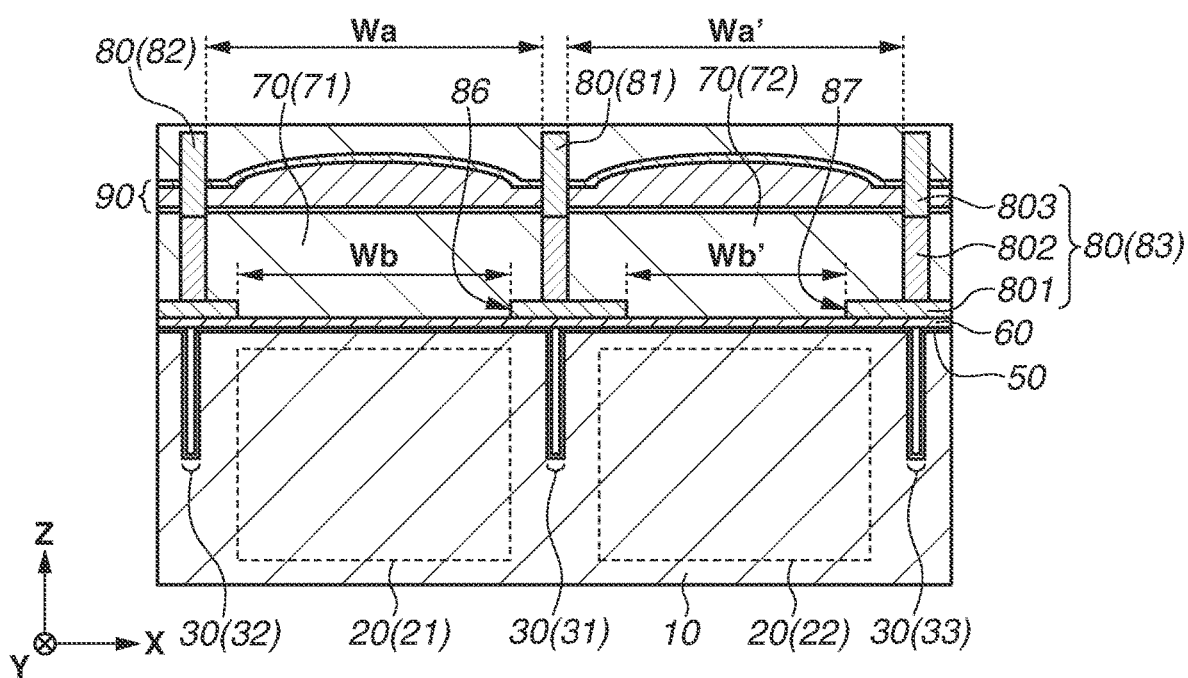

A forth exemplary embodiment as a modified example of the second exemplary embodiment will be described with reference to FIGS. 6A and 6B. The light shielding portions 81 and 82 are formed by the light shielding member 80. The light shielding member 80 (lower part 801) includes openings 86 and 87. The opening 86 surrounds the light transmitting region 71. The opening 87 is arranged above another photoelectric conversion portion 22 among the plurality of photoelectric conversion portions 20. The area of the opening 86 is different from the area of the opening 87. In the present exemplary embodiment, the area of the opening 87 of the lower right pixel is less than the area of the opening 86. The distance Wb' between the lower edges of the light shielding portions 81 and 82 above the photoelectric conversion portion 22 is less than the distance Wb between the lower edges of the light shielding portions 81 and 83 (Wb'<Wb). On the other hand, the distance Wa' between the upper edges of the light shielding portions 81 and 82 above the photoelectric conversion portion 22 is equal to the distance Wa between the lower edges of the light shielding portions 81 and 83 (Wa'=Wa). The distances Wa and Wa' can be different, but the difference between the distances Wa and Wa' is desirably smaller than the difference between the distances Wb and Wb' (Wa−Wa'<Wb−Wb'). In FIGS. 6A and 6B, the opening of the light shielding member 80 of the lower right pixel is small, and in a case in which uniform light enters, the output of the lower right pixel is less than those of the other pixels. In this structure, the sensitivity ratio between the lower right pixel and the other pixels is adjustable. For example, the color ratio is adjustable by changing the opening shape for each pixel color. Further, shading is correctable by changing the opening shapes at the center and the peripheral to be different from each other.

Figure 7A:
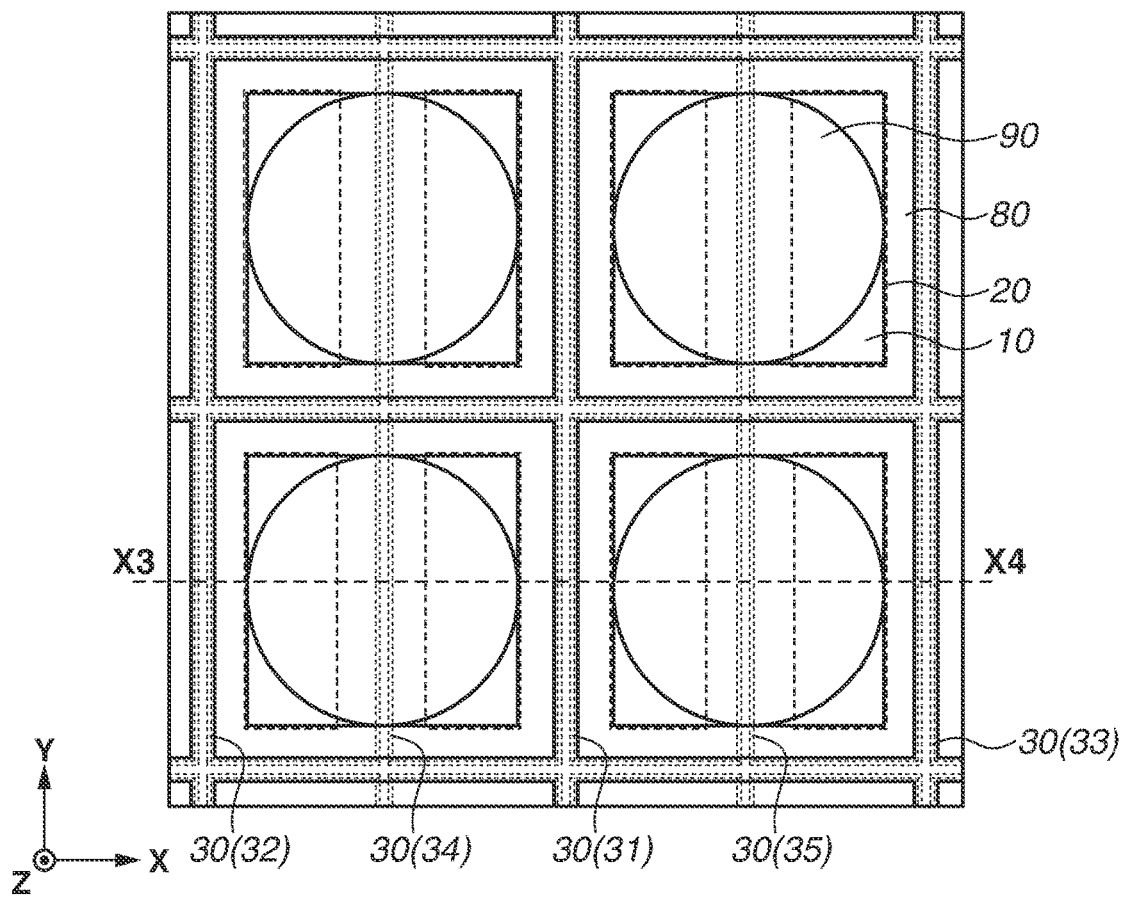
FIGS. 7A and 7B are diagrams schematically illustrating a photoelectric conversion apparatus.
Figure 7B:
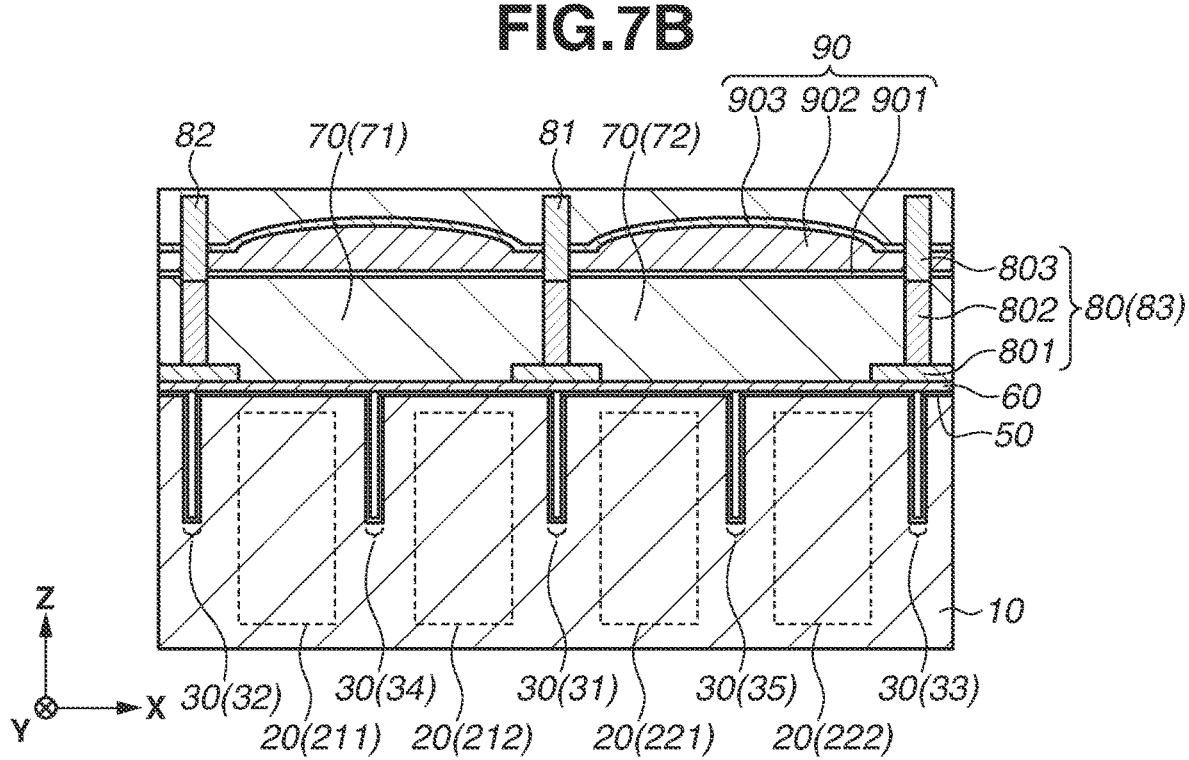

A fifth exemplary embodiment as a modified example of the second exemplary embodiment will be described with reference to FIGS. 7A and 7B. At least two photoelectric conversion portions 211 and 212 are located below the light transmitting region 71 between the light shielding portions 81 and 82. Each pixel is provided with a plurality of photoelectric conversion portions to thereby enable distance measurement by phase difference detection method using pupil division and focal point detection. Alternatively, each pixel can be provided with a plurality of photoelectric conversion portions of different properties to thereby increase the dynamic range of photoelectric conversion. The trench 30 is located between the photoelectric conversion portions 211 and 212, and a separation portion 34 for the separation in the pixels is provided in the trench 30 between the photoelectric conversion portions 211 and 212. Similarly, a separation portion 35 for the separation in the pixels is provided in the trench 30 between the photoelectric conversion portions 221 and 222. While the separation portions 34 and 35 are used as separation portions for the separation in the pixels, the separation portions 31, 32, and 33 are used as separation portions for the separation between the pixels. The separation portions 34 and 35 for the separation in the pixels are provided to reduce crosstalk between the photoelectric conversion portions 211 and 212 or crosstalk between the photoelectric conversion portions 221 and 222, and thus the separation accuracy is improved.

Figure 8A:
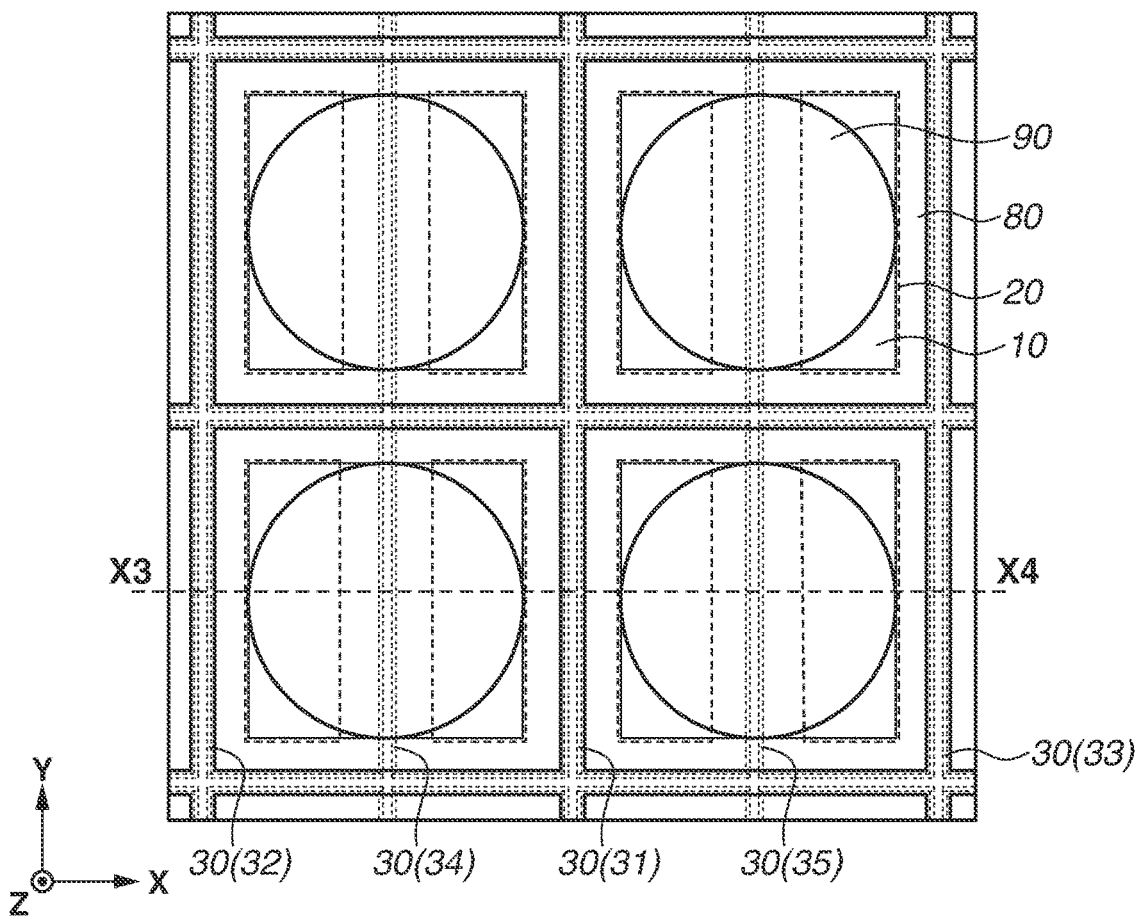
FIGS. 8A and 8B are diagrams schematically illustrating a photoelectric conversion apparatus.
Figure 8B:
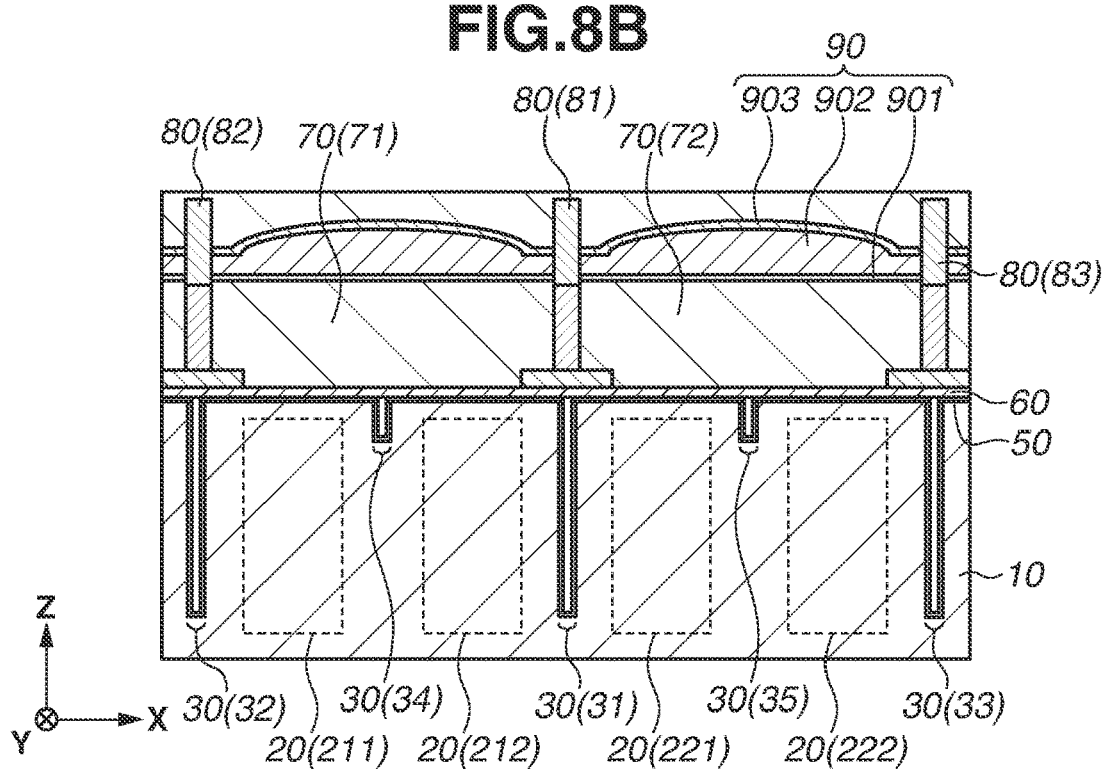

A sixth exemplary embodiment as a modified example of the second exemplary embodiment will be described with reference to FIGS. 8A and 8B. In the fifth exemplary embodiment, the trench 30 which continues from the back surface 102 and has a smaller width than the width of the separation portions 31 and 32 is provided between the two photoelectric conversion portions 211 and 212. In the trench 30 having the small width, the separation portion 34 having a smaller width than the width of the separation portions 31 and 32 is provided. Further, the trench 30 which continues from the back surface 102 and has a smaller depth than the depth of the separation portions 31 and 33 is provided between the two photoelectric conversion portions 221 and 222. In the trench 30 having the small depth, the separation portion 35 having a smaller depth than the depth of the separation portions 31 and 33 is provided. The widths and depths of the separation portions 34 and 35 for the separation in the pixels are made to be smaller than the widths and depths of the separation portions 31, 32, and 33 for the separation between the pixels so that loss in sensitivity is reduced. The central part of the pixel is the part to which incident light is converged by the interlayer lenses 91 and 92 and which significantly contributes to the photoelectric conversion. The width and depth of the trench 30 in the region are reduced to reduce light beams blocked by the separation portions 34 and 35, and thus the sensitivity is improved.

<Equipment Including Photoelectric Conversion Apparatus>

The equipment EQP illustrated in FIG. 1B will be described in detail. The photoelectric conversion apparatus APR may have a structure (chip-layered structure) in which a first semiconductor chip provided with a plurality of photoelectric conversion portions and a second semiconductor chip provided with a peripheral circuit are layered. Each peripheral circuit of the second semiconductor chip can be a column circuit corresponding to a pixel column of the first semiconductor chip. Further, each peripheral circuit of the second semiconductor chip can be a matrix circuit corresponding to a pixel or a pixel block of the first semiconductor chip. The first and second semiconductor chips are connected by a through-electrode (through-silicon via (TSV)), wiring between the chips by directly bonding a conductor such as copper, micro-bump between the chips, wire bonding.

The photoelectric conversion apparatus APR can include the package PKG configured to store the semiconductor device IC, besides the semiconductor device IC. The package PKG can include a substrate to which the semiconductor device IC is fixed, a cover made of, for example, glass facing the semiconductor device IC, and a connection member such as a bonding wire or a bump configured to connect a terminal provided to the substrate and a terminal provided to the semiconductor device IC.

The equipment EQP can further include at least one of the optical system OPT, the control apparatus CTRL, the processing apparatus PRCS, the display apparatus DSPL, and the storage apparatus MMRY. The optical system OPT forms an image on the photoelectric conversion apparatus APR as a photoelectric conversion apparatus and is, for example, a lens, a shutter, and a mirror. The control apparatus CTRL is configured to control the photoelectric conversion apparatus APR and is, for example, a semiconductor device such as an application-specific integrated circuit (ASIC). The processing apparatus PRCS is configured to process a signal output from the photoelectric conversion apparatus APR and forms an analog front end (AFE) or digital front end (DFE). The processing apparatus PRCS is a semiconductor device such as a central processing unit (CPU) or ASIC. The display apparatus DSPL is an electroluminescent (EL) display apparatus or liquid crystal display apparatus configured to display information (image) acquired by the photoelectric conversion apparatus APR. The storage apparatus MMRY is a magnetic device or a semiconductor device configured to store information (image) acquired by the photoelectric conversion apparatus APR. The storage apparatus MMRY is a volatile memory such as a static random access memory (SRAM) or dynamic random access memory (DRAM) or a non-volatile memory such as a flash memory or a hard disk drive. The mechanical apparatus MCHN includes a movable or driving portion such as a motor or an engine. In the equipment EQP, a signal output from the photoelectric conversion apparatus APR is displayed on the display apparatus DSPL or externally transmitted by a communication apparatus (not illustrated) of the equipment EQP. Accordingly, the equipment EQP desirably further includes the storage apparatus MMRY and the processing apparatus PRCS in addition to a storage circuit unit and a calculation circuit unit of the photoelectric conversion apparatus APR.

The equipment EQP illustrated in FIG. 1A can be an electronic apparatus such as an information terminal having an image capturing function (e.g., smartphone or wearable terminal) or a camera (e.g., interchangeable-lens camera, compact camera, video camera, monitoring camera). The mechanical apparatus MCHN in a camera is capable of driving the components of the optical system OPT for a zooming, focusing, or shutter operation. Further, the equipment EQP can be a transportation apparatus (movable transportation) such as a vehicle, a ship, or a flying vehicle. Further, the equipment EQP can be a medical apparatus such as an endoscope or computed tomographic (CT) scanner.

The mechanical apparatus MCHN in the transportation apparatus can be used as a movable apparatus. The equipment EQP as transportation apparatus is suitable for those that transport the photoelectric conversion apparatus APR, assist in operation (manipulation) using an imaging function, and/or perform automation. The processing apparatus PRCS configured to assist in operation (manipulation) and/or perform automation is capable of performing the processing of operating the mechanical apparatus MCHN as a movable apparatus based on the information acquired by the photoelectric conversion apparatus APR.

The photoelectric conversion apparatus APR in the present exemplary embodiment can provide high advantage to the designer, manufacturer, seller, buyer, and/or user of the photoelectric conversion apparatus APR. Accordingly, if the photoelectric conversion apparatus APR is mounted on the equipment EQP, the value of the equipment EQP is also increased. Therefore, it is advantageous to mount the equipment EQP on the photoelectric conversion apparatus APR in the present exemplary embodiment in terms of increasing the value of the equipment EQP in the manufacture and sales of the equipment EQP.

The present technique is capable of providing a photoelectric conversion apparatus with reduced crosstalk.

Various changes can be made to the above-described exemplary embodiments within the scope of the technical concept of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-022398, filed Feb. 9, 2018, which is hereby incorporated by reference herein in its entirety.

What is claimed is:

1. A photoelectric conversion apparatus, comprising:
a semiconductor layer having a front surface and a back surface and in which a plurality of photoelectric conversion portions is provided between the front surface and the back surface;
a wiring structure arranged on the front surface side of the semiconductor layer;
a separation portion arranged between the plurality of photoelectric conversion portions and formed by a trench continuing from the back surface;
a first light shielding portion arranged above the semiconductor layer on the back surface side so as to overlap the separation portion; and
a second light shielding portion arranged above the semiconductor layer on the back surface side so as to face the first light shielding portion via a region arranged above at least one photoelectric conversion portion among the plurality of photoelectric conversion portions,
wherein a surface of the first light shielding portion that is located so as to face the second light shielding portion has a first edge located on the semiconductor layer side,
wherein the first edge is connected to a bottom surface of the first light shielding portion,
wherein at the first edge, an angle formed by the surface and the bottom surface is less than 90 degrees,
wherein a surface of the second light shielding portion that is arranged so as to face the first light shielding portion has a second edge located on an opposite side of the second light shielding portion to the semiconductor layer side, and a boundary between the back surface and a side surface of the separation portion that is arranged adjacent the photoelectric conversion portion side is positioned below the first light shielding portion, and
wherein the first edge is below a line connecting the second edge and the boundary.

2. The photoelectric conversion apparatus according to claim 1, wherein a distance L between the first edge and the boundary in a first direction along the back surface is 100 nm to 1 μm, and a distance W between the first edge and the second edge in the first direction is 500 nm to 5 μm and $L<0.4\times W$.

3. The photoelectric conversion apparatus according to claim 1, wherein a distance D between the first edge and the boundary is 50 nm to 500 nm, and a distance L between the first edge and the boundary in a first direction along the back surface is 100 nm to 1 μm, and $D<L$.

4. The photoelectric conversion apparatus according to claim 1, wherein at least one of (1) a distance D between the first edge and the boundary is less than a width G of the separation portion in the first direction at a position at which the width is a half of a length of the separation portion in the second direction and (2) a distance L between the first edge and the boundary in a first direction along the back surface is less than D is satisfied, and a distance W between the first edge and the second edge in the first direction is 2 μm or less.

5. The photoelectric conversion apparatus according to claim 1, wherein a width G of the separation portion in the first direction at a position at which the width is a half of a length of the separation portion in the second direction is less than a distance L between the first edge and the boundary in a first direction along the back surface, and L is 100 nm to 1 μm.

6. The photoelectric conversion apparatus according to claim 1,
wherein $Wa-Wb>Wc/2$ is satisfied,
where Wa is the distance between the second edge and the first light shielding portion in a first direction along the back surface of the semiconductor layer,
Wb is a distance between the first edge and the second light shielding portion in the first direction,
Wc is a width of the first light shielding portion in the first direction at a height located at an equal distance from the first edge and the second edge.

7. The photoelectric conversion apparatus according to claim 6, wherein at least one of $Wc<G$ and $G<3\times Wc/2$ is satisfied,
where G is the width of the separation portion in the first direction at a position at which the width is a half of a length of the separation portion in the second direction.

8. The photoelectric conversion apparatus according to claim 6, wherein a position in the region at which a distance from the first edge in the first direction is Wb/2 does not overlap a position in the region at which a distance from the second edge in the first direction is Wa/2.

9. The photoelectric conversion apparatus according to claim 1,
wherein a light shielding member forming the first light shielding portion and the second light shielding portion includes a lower part having the first edge and an upper part having the second edge, and a width of the lower part in the first direction is more than a width of the upper part in the first direction, and
wherein a thickness of the lower part in the second direction is less than a thickness of the upper part in the second direction.

10. The photoelectric conversion apparatus according to claim 1, wherein the first light shielding portion and the second light shielding portion are formed by a light shielding member including a first opening surrounding the region and a second opening positioned above another one of the plurality of photoelectric conversion portions, and an area of the second opening is different from an area of the first opening.

11. The photoelectric conversion apparatus according to claim 1, wherein at least two of the plurality of photoelectric conversion portions are positioned below the region between the first light shielding portion and the second light shielding portion.

12. The photoelectric conversion apparatus according to claim 11, wherein a trench continuing from the back surface and having a width less than the width of the separation portion, is provided between the two photoelectric conversion portions, and/or wherein a trench continuing from the back surface and has a depth less than the depth of the separation portion is provided between the two photoelectric conversion portions.

13. The photoelectric conversion apparatus according to claim 1, further comprising a microlens (ML) arranged above the region, wherein the width of the first light shielding portion is more than 100 nm, and wherein a distance from the back surface to the microlens is more than a distance H between the back surface and the second edge in a second direction from the front surface toward the back surface.

14. The photoelectric conversion apparatus according to claim 1, wherein the distance between the first edge and the boundary in the second direction is 50 nm to 500 nm, the distance between the first edge and the boundary in the first direction is 100 nm to 1 µm, and the distance between the first edge and the second edge in the first direction is 500 nm to 5 µm.

15. The photoelectric conversion apparatus according to claim 1, wherein a lens is provided between the first light shielding portion and the second light shielding portion in the first direction.

16. The photoelectric conversion apparatus according to claim 1, further comprising a color filter (CF) arranged above the region, wherein a distance from the back surface to the color filter is more than the distance H, and wherein the depth of the separation portion in the second direction is more than a quarter of the distance between the back surface and the front surface.

17. A photoelectric conversion apparatus, comprising:
a semiconductor layer having a front surface and a back surface and in which a plurality of photoelectric conversion portions is provided between the front surface and the back surface;
a wiring structure arranged on the front surface side of the semiconductor layer;
a first separation portion having a first width and a first depth and arranged between the plurality of photoelectric conversion portions and formed by a trench continuing from the back surface;
a first light shielding portion arranged above the semiconductor layer on the back surface side so as to overlap the first separation portion;
a second light shielding portion arranged above the semiconductor layer on the back surface side so as to face the first light shielding portion via a region arranged above first and second photoelectric conversion portions among the plurality of photoelectric conversion portions; and
a second separation portion having a second width smaller than the first width and a second depth smaller than the first depth and formed by a trench positioned between the first and second photoelectric conversion portions,
wherein a surface of the first light shielding portion that is located so as to face the second light shielding portion has a first edge located on the semiconductor layer side,
wherein a surface of the second light shielding portion that is arranged so as to face the first light shielding portion has a second edge located on an opposite side of the second light shielding portion to the semiconductor layer side, and a boundary between the back surface and a side surface of the separation portion that is arranged adjacent the photoelectric conversion portion side is positioned below the first light shielding portion, and
wherein the first edge is below a line connecting the second edge and the boundary.

18. The photoelectric conversion apparatus according to claim 17, wherein an insulation film is arranged between the first light shielding portion and the trench in the second direction, wherein the metal oxide film is arranged between the insulation film and the semiconductor layer, and the metal oxide film is thinner than the insulation film.

19. The photoelectric conversion apparatus according to claim 1, wherein an insulation film is provided between the first light shielding portion and the back surface, and the first light shielding portion is electrically connected to the semiconductor layer.

20. Equipment comprising the photoelectric conversion device according to claim 1, the equipment further comprising at least one of:
an optical system configured to form an image on the photoelectric conversion device;
a control apparatus configured to control the photoelectric conversion device;
a processing apparatus configured to process a signal output from the photoelectric conversion device;
a mechanical apparatus controlled based on information acquired by the photoelectric conversion device;
a display apparatus configured to display the information acquired by the photoelectric conversion device; and
a storage apparatus configured to store the information acquired by the photoelectric conversion device.

21. The equipment according to claim 20,
wherein G<L is satisfied, where G is the width of the separation portion in a first direction at a position at which the width is a half of a length of the separation portion in a second direction and L is a distance between the first edge and the boundary in the first direction, the distance between the first edge and the boundary in the second direction is 50 nm to 500 nm, and the distance between the first edge and the second edge in the first direction is 500 nm to 5 µm.

22. The equipment according to claim 21, wherein D<L is satisfied, and L is 100 nm to 1 µm, where D is a distance between the first edge and the boundary in the second direction.

23. The photoelectric conversion apparatus according to claim 6,
wherein
the first light shielding portion has a top surface located at a position that is opposite of the bottom surface, and
the width of the first light shielding portion on the bottom surface is greater than Wc, and the width of the first light shielding portion on the top surface is less than Wc.

* * * * *